(12) United States Patent
Zhang et al.

(10) Patent No.: US 8,007,910 B2
(45) Date of Patent: Aug. 30, 2011

(54) ULTRAHARD MULTILAYER COATING COMPRISING NANOCRYSTALLINE DIAMOND AND NANOCRYSTALLINE CUBIC BORON NITRIDE

(75) Inventors: Wenjun Zhang, Hong Kong (CN); Shuit-Tong Lee, Hong Kong (CN); Igor Bello, Hong Kong (CN); Kar Man Leung, Ontario (CA); He-qin Li, Hefei Anhui (CN); You-Shen Zou, Jiangxi Province (CN); Yat Ming Chong, Hong Kong (CN); Kwok Leung Ma, Hong Kong (CN)

(73) Assignee: City University of Hong Kong, Kowloon (HK)

( * ) Notice: Subject to any disclaimer, the term of this patent is extended or adjusted under 35 U.S.C. 154(b) by 484 days.

(21) Appl. No.: 11/880,115

(22) Filed: Jul. 19, 2007

(65) Prior Publication Data

US 2009/0022969 A1   Jan. 22, 2009

(51) Int. Cl.
*B32B 9/00* (2006.01)
(52) U.S. Cl. ........ 428/408; 428/216; 428/336; 428/698; 428/704
(58) Field of Classification Search .......... 428/216, 428/336, 408, 698, 704
See application file for complete search history.

(56) References Cited

U.S. PATENT DOCUMENTS

| | | | |
|---|---|---|---|
| 4,619,865 A * | 10/1986 | Keem et al. | 428/698 |
| 4,707,384 A * | 11/1987 | Schachner et al. | 428/408 |
| 4,783,368 A * | 11/1988 | Yamamoto et al. | 428/408 |
| 5,117,267 A * | 5/1992 | Kimoto et al. | 257/76 |
| 5,639,551 A * | 6/1997 | Ong et al. | 428/408 |
| 5,656,828 A * | 8/1997 | Zachai et al. | 428/408 |
| 6,054,719 A * | 4/2000 | Fusser et al. | 257/77 |
| 7,060,345 B2 * | 6/2006 | Fukui et al. | 428/698 |
| 2006/0147282 A1 * | 7/2006 | Bello et al. | 428/698 |

OTHER PUBLICATIONS

Zhang, et al., "Epitaxy on Diamond by Chemical Vapor Deposition: A Route to High-Quality Cubic Boron Nitride for Electronic Applications," Adv. Mater., Aug. 18, 2004, vol. 16, No. 16, pp. 1405-1408.
Zhang, et al., "Epitaxy of cubic boron nitride on (001)-oriented diamond," Nature Publishing Group, 2003, pp. 1-4.
Sproul, William D., "New Rules in the Preparation of Mechanically Hard Films," Science, vol. 273, Aug. 16, 1996, pp. 889-892.

(Continued)

*Primary Examiner* — Archene Turner
(74) *Attorney, Agent, or Firm* — Heslin Rothenberg Farley & Mesiti P.C.

(57) ABSTRACT

A multilayer coating (MLC) is composed of two chemically different layered nanocrystalline materials, nanodiamond (nanoD) and nano-cubic boron nitride (nono-cBN). The structure of the MLC and fabrication sequence of layered structure are disclosed. The base layer is preferably nanoD and is the first deposited layer serving as an accommodation layer on a pretreated substrate. It can be designed with a larger thickness whereas subsequent alternate nano-cBN and nanoD layers are typically prepared with a thickness of 2 to 100 nm. The thickness of these layers can be engineered for a specific use. The deposition of the nanoD layer, by either cold or thermal plasma CVD, is preceded by diamond nucleation on a pretreated and/or precoated substrate, which has the capacity to accommodate the MLC and provides excellent adhesion. Nano-cBN layers are directly grown on nanodiamond crystallites using ion-assisted physical vapor deposition (PVD) and ion-assisted plasma enhanced chemical vapor deposition (PECVD), again followed by nanodiamond deposition using CVD methods in cycles until the intended number of layers of the MLC is obtained.

16 Claims, 8 Drawing Sheets

OTHER PUBLICATIONS

Jiang, X. and Klages, C.-P., "Heteroepitaxial diamond growth on (100) silicon," Diamond Relat. Mater., vol. 2, 1993, pp. 1112-1113.

Gruen, Dieter M., "Nanocrystalline Diamond Films," Annu. Rev. Mater. Sci., 1999, pp. 211-260.

Gruen, et al., "Fullerenes as precursors for diamond film growth without hydrogen or oxygen additions," Appl. Phys. Lett., vol. 64, No. 12, Mar. 21, 1994, pp. 1502-1504.

Gruen, et al., "Buckyball microwave plasmas: Fragmentation and diamond-film growth," J. Appl. Phys., vol. 75, No. 3, Feb. 1, 1994, pp. 1758-1763.

Bhattacharyya, et al., "Synthesis and characterization of highly-conducting nitrogen-doped ultrananocrystalline diamond films," American Institute of Physics, 2001, pp. 1441-1443.

Mirkarimi, et al., "Review of advances in cubic boron nitride film synthesis," Materials Science and Engineering R21, 1997, pp. 47-100.

* cited by examiner

ULTRAHARD MULTILAYER COATING COMPRISING NANOCRYSTALLINE DIAMOND AND NANOCRYSTALLINE CUBIC BORON NITRIDE

FIELD OF THE INVENTION

The present invention relates to an ultra-smooth, ultra-hard coating material in the form of a multilayer coating (MLC) made of two layer types, nanodiamond (NanoD) and nanocrystalline cubic boron nitride (nano-cBN) prepared by sequential depositions.

BACKGROUND OF THE INVENTION

Boron nitride (BN) is a synthetic material that has been prepared in different forms including hexagonal BN (hBN), rhombohedral BN (rBN), wurtzitic BN (wBN), and cubic BN (cBN). These allotropes are analogous to carbon structures and have $sp^2$-hybridized (hBN and rBN) and $sp^3$-hybridized (wBN and cBN) bonding phases. The most attractive BN allotrope is cBN which has properties similar to diamond as a consequence of high atomic density and strong covalent and ionic chemical bonds. Cubic BN has the second highest hardness and thermal conductivity next to diamond, but its chemical inertness to ferrous and steel materials at high temperature, resistance against oxidation and thermal stability make it superior to diamond and the best material in mechanical applications involving hard steels.

Coating machining tools with cBN films can improve their performance, but film thickness and film adherence are very important prerequisites in related mechanical applications. For instance, the coating thickness for cutting tools is typically 2-4 micrometers. However, cBN films are usually thinner and grown via soft and humidity-sensitive amorphous/turbostratic BN (aBN/tBN) precursor layers on many substrates. It is thus very challenging to prepare thick and adherent cBN films with long-term stability. In addition, energetic ion bombardment (tens to hundreds of eV) is still essential to facilitate cBN formation during the film growth, and consequently induces very high compressive stress, limiting the film thickness and contributing to film delamination. The compatibility of cBN and diamond, in terms of lattice parameter and physical properties, enables the heteroepitaxial growth of cBN films on diamond under proper conditions. Therefore, problems such as poor film adhesion and appearance of aBN/tBN interfacial layers have been solved by the introduction of polycrystalline diamond interfacial layers. However, the cBN growth process still cannot be accomplished without ion bombardment regardless of whether physical or plasma-enhanced chemical vapor deposition (PVD or PECVD) methods are used. The energetic particles promote the formation of $sp^3$ bonding but they also induce considerable compressive stress. The high overall stress accumulates with increasing film thickness and may cause film delamination when the film thickness exceeds a certain critical value though cBN films can grow fairly thick on substrates coated with diamond.

SUMMARY OF THE INVENTION

According to the present invention there is provided a multilayer coating formed on a substrate, comprising: a base layer, and a plurality of nano-cBN and nanodiamond layers deposited on the base layer in alternate sequence, wherein the cBN nanocrvtallites nucleate directly on nanoD crystallites in the plurality of nano-cBN and nanodiamond layers.

Preferably the base layer is a layer of nanodiamond and the first layer in the alternating sequence is a layer of nano-cBN. However, the base layer may be a layer of single crystalline diamond or polycrystalline diamond (or even diamond-like carbon or various nitrides) in which case the first layer in the alternating sequence is a layer of nanodiamond. A buffer layer may be provided between the substrate and the base layer.

Preferably the plurality of alternating layers each have a thicknesses ranging from 1 to 100 nm, though the base layer may have a greater thickness. The plurality of alternating layers may terminate with a top nano-cBN layer or with a top nano-diamond layer.

The substrate is preferably selected from the group consisting of semiconductors, insulators, metals, and alloys. The substrate may be pre-treated, for example by the processes of enhanced seeding in hard powder suspension, prescratching, chemical etching and/or bias enhanced nucleation before depositing the base layer.

The nanocrystalline diamond films are preferably deposited by cold and thermal plasma CVD. The first layer of nanodiamond may be polished prior to subsequent cBN deposition, and the nano-cBN layers may be deposited by ion-assisted physical vapor deposition (PVD) and/or plasma-enhanced (or ion assisted) chemical vapor deposition (PECVD). Alternatively the nano-cBN layers are deposited by cold or thermal plasma CVD, and a negative bias may be applied to the substrate during said deposition processes.

BRIEF DESCRIPTION OF THE DRAWINGS

Some embodiments of the invention will now be described by way of example and with reference to the accompanying drawings, in which.

DESCRIPTION OF THE PREFERRED EMBODIMENTS

Figure 1:
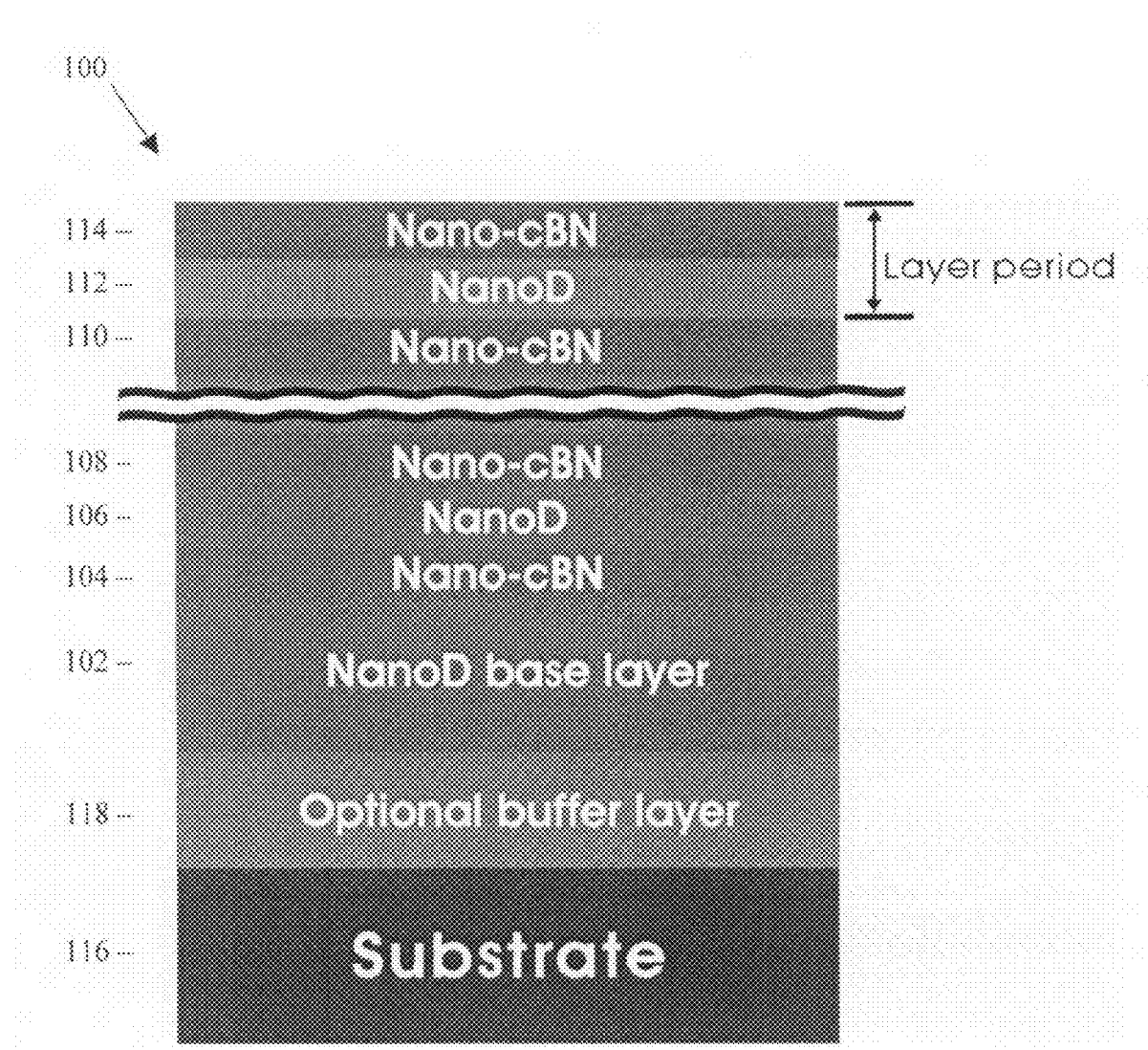
FIG. 1 is a schematic drawing of a MLC according to one example of the invention and comprising alternating nanocrystalline diamond (nanoD) and nanocrystalline cBN (nano-cBN) layers.

At least in its preferred forms, the present invention provides nanoD/nano-cBN MLC structures and methods of their fabrication via multiple steps. Examples of the present invention are described in detail below with reference to the accompanying drawings through illustration of preferred embodiments.

As will be seen from the following description of preferred embodiments, the present invention at least in its preferred forms provides a MLC with a nanocrystalline superlattice structure composed of several to many alternating layers of nanocrystalline diamond (NanoD) and nanocrystalline cubic boron nitride (nano-cBN). The MLC is a composite material with novel and extreme properties surpassing the properties of the constituent materials (nano-cBN and nanoD) from which the MLC is formed. MLCs constructed in accordance with embodiments of the invention have the combined characteristics of reduced stress, high adhesion, extreme hardness, extreme thermal conductivity (note: thermal conductivity-heat conduction), extreme heat resistance, and extreme abrasion resistance. These attributes together with ultra smooth surfaces enable the wide applications of these MLCs in diverse fields. The MLCs formed in accordance with embodiments of the invention can protect chemically and mechanically the surfaces of products, and can increase chemical and mechanical resistance and heat dissipation. The individual layers are however designed for each particular use with specific thickness. The properties of an MLC can therefore be engineered for tooling, tribological and geothermal use, space, military, aviation, injection systems, electronics and even the coating of some consumer products. Since MLCs in accordance with embodiments of the invention have extreme properties, including wear resistance, low friction coefficient, high chemical inertness, low coefficient of thermal expansion, they are therefore attractive for use in construction of microelectromechanical systems (MEMS).

The enhancement of material properties is obtained via the compatibility of the two materials (nanoD and nano-cBN). Both materials have similar nanocrystalline structures, lattice parameters and other physical properties. However, the chemical and thermal stability of nano-cBN surpass those of diamond and NanoD. Since NanoD is nanocrystalline and can easily adapt to various substrates, the MLC is preferably made with a bottom nanoD layer and terminated by a top nano-cBN layer. The alternating layers can be prepared on either on some substrates directly or grown via buffer layers, which could be pretreated nitrides or carbides. The substrates can also be pretreated, for instance, by prescratching, ultrasonic seeding, chemical etching, incorporation of some catalytic components, or introduction of elemental constituents contained in the substrate materials to avoid induction of soft graphitic structures by chemical effects, and enhance adhesion of the composite layered materials. The thickness of each layer in the multilayer coating is preferably smaller than 100 nm. The thickness of individual layers can be engineered from a few to tens of nanometers while the total film thickness may vary from 0.5 to over 5 µm in accordance with the purpose of the coatings.

The MLC can be produced by a method which involves multiple steps as will be described below in more detail. The substrates are firstly pretreated with the aid of prescratching, ultrasonic seeding, and chemical etching methods or their combination. The pretreated substrates can be coated with a buffer layer, for example, nitride or carbide layers or their composites and gradient layers. The buffer layers can further be treated or polished. The compatibility and adherence of the alternating layers to the substrate is provided by the pretreatment processes and/or the buffer layers. The NanoD layers in the MLC structure may be prepared by chemical vapor deposition (CVD) methods whereas the cBN layers can be deposited by either ion-assisted CVD or PVD.

The base layer of the MLC can be thicker nanoD (1 to 2 µm) serving as a supporting layer to the whole MLC structure and confining certain stress. The nanoD film is prepared in a two-step process: nucleation and growth. Diamond nuclei are formed by either bias-enhanced nucleation or mechanical prescratching and alternatively ultrasonic seeding the substrates/buffer layers. The nano-cBN layers can grow directly and also epitaxially on diamond nanocrystallites without amorphous and tBN transition layers since cBN and diamond have very similar physical properties and crystallographic structures. The MLC structures are completed by consecutive nanoD and nano-cBN deposition in alternate sequence until a few to tens or even hundreds of layers are deposited.

The MLC structure to be described in more detail below reduces not only the film stress but also considerably enhances the coating properties. One of the reasons for the reduced stress using this concept is the smaller amount of cBN, which is the major source of film stress, involved in the total film volume. Engineering the MLC with attention to the thickness of individual layers can enhance the material properties in specific applications and provide, for instance, coatings which are highly resistant to abrasion. In particular, the nanometer-scale multilayer structure greatly enhances hardness owing to superlattice strength enhancement. The phenomenon of enhancement of mechanical properties was demonstrated employing superlattice structures. [W. D. Sproul, *Science*, vol. 273, pps. 889-892, "New routes in the preparation of mechanically hard films", 1996, which is hereby incorporated by reference herein in its entirety]. However, the selection of suitable counterpart of nano-cBN for the construction of a multilayer structure is very limited because of matching their physical properties and consequent emergence of extensive interfacial regions with weak $sp^2$ bonding phases. The excellent choice is nanoD with the closest matching of the physical properties and capacity of direct cBN growth under proper deposition conditions. Nanodiamond films are structures consisting of diamond crystallites with a size of ~5 to tens of nm. They prevalently preserve the diamond properties while maintain extremely smooth surfaces.

MLCs according to embodiments of the present invention are more practical than coatings made of an individual cBN layer when applied to cutting tools because the stress of the multilayer coating is lower, the mechanical properties are considerably improved whereas the chemical stability of the overall coating is preserved by the topmost cBN layer.

FIG. 1 shows a schematic drawing of a MLC 100 according to an example of the invention comprising two layer types, alternating nanoD and nano-cBN. The MLC may comprise multiple nanoD and nano-cBN layers, the thicknesses of which can be engineered from a fraction of nm to 100 nm for specific uses. The base layer 102 of the MLC is nanoD which can be constructed thicker (e.g., 2 µm) than the layers above. The MLC comprises the base layer and alternating layers of Nano-cBN and NanoD created over the base layer, e.g., layers 104, 106, 108 . . . 110, 112 and 114. The MLC is created on a substrate 116 with an optional buffer layer 118 between the substrate and the MLC terminates with a top nano-cBN layer. Since the overall film thickness can readily be grown over 5 µm, the MLC meets all requirements for mechanical applications (typical coating thickness on tools is 2-4 µm). The multilayer MLCs according to examples of the invention are prepared on pretreated substrates or substrates coated with buffer layers.

All substrates have to be pretreated or/and precoated to provide high adherence of the MLC to the substrate. The pretreatment can be a single- or multiple-step process. The pretreatment can include prescratching or/and ultrasonic seeding to furnish high nucleation density and enhance adhesion. These processes may proceed by chemical etching of substrates to deplete some undesirable chemical elements, with catalytic effects on conversion of diamond to graphite in the near-surface regions. Excessive etching however may considerably affect the mechanical strength of the substrates over their etched depth. Diffusion barriers or gradient buffer layers can also isolate these undesirable chemical elements. The buffer layers also can minimize the differences in physical properties of the MLC according to the invention and the substrates, particularly the stress introduced by differences in thermal expansion of the substrates and coating. Both the buffer layer and gradient layer can moderate the stress transition at the substrate-coating interface. Properly selected hard carbides, nitrides, their compounds, and gradient layers in accordance with the substrate used are important to accommodate the MLC.

In embodiments of the present invention, a thicker nanoD base layer (e.g., 2 μm) is preferable to provide mechanical supporting capacity of the MLC, while the thickness of each upper cBN and diamond layers may be less than 100 nm, but can also be thicker for some specific applications. The base and intermediate diamond layers adjacent to nano-cBN are nanocrystalline diamond (NanoD) films. Using nanoD in the multilayered structure overcomes many problems including surface roughness and structural compatibility. As-deposited coatings with ultra smooth surfaces are then suitable for coating on precision tools and for preparing tribological surfaces. No polishing is required after deposition. The coating is then cost-effective when compared with coatings using polycrystalline diamond with surface roughness up to several micrometers.

Prior to the deposition of the NanoD base layer, nucleation takes place on a pretreated and/or precoated substrate which has the capacity to accommodate the MLC and provides excellent adhesion. Firstly diamond is nucleated using either bias-enhanced CVD nucleation [X. Jiang et al., *Diamond Relat. Mater.*, vol 2, pps. 1112-1113, "Heteroepitaxial diamond growth on (100) silicon", 1993, which is hereby incorporated by reference herein in its entirety] on a non-diamond substrate or enhanced nucleation is achieved employing scratching non-diamond substrates by hard powders of different composition and size such as diamond, SiC, $Al_2O_3$ or cBN. Secondly nanoD layers are grown in plasmas of higher methane concentration (~10%) in hydrogen or lower methane concentration in hydrogen-depleted (e.g., He, Ar) gas mixtures. The deposition of nano-D layers can also be performed by or using bias-assisted growth. Thirdly, the cBN layers are deposited by either CVD or PVD methods.

In the preferred embodiments of this invention, a number of parameters of the fabrication process, such as the choice of substrates, pretreatment, precoating, nucleation technique, the method of forming the nanoD layer, and the method of preparing the nano-cBN layer, can vary depending upon the particular substrate and the intended use of the resulting MLC. In embodiments of the present invention, the deposition of the MLC can be prepared on a variety of non-diamond substrates including semiconductors (e.g., silicon or silicon carbide and nitride), insulators (e.g., quartz and sapphire), metals (e.g., platinum and iridium), and alloys (e.g., tungsten carbide), which however should be pretreated as described above. Alternatively, the pretreated substrates can be coated with a buffer layer, for example, nitride or carbide layers or their compounds and gradient layers. The buffer layers can further be prescratched. All these pretreatments and precoatings can be combined prior to the deposition of the MLC.

In the preparation of NanoD layers, CVD environments including either cold or thermal plasma being excited by supplying electric energy from various sources, e.g., direct current (DC) or alternating current (AC) sources including high frequency, radio-frequency, microwave and other electromagnetic radiation sources. Depending on the excitation method used, power can be supplied into the plasma via internal electrodes, capacitive and inductive coupling, antenna coupling, resonator coupling, surface-wave excitation or other known methods. In the case of NanoD deposition demonstrated as an example below, cold plasma was induced by microwaves, which were fed into a reactor via an impedance transformer. The crystallite size of NanoD in the MLC is controlled by the growth condition using $CH_4/H_2$ plasma or $CH_4$/inert gas (Ar) plasma [D. M. Gruen, Annu. Rev Mater. Sci. 29, (1999) 211; D. M. Gruen, S. Liu, A. Krauss, L. Luo, X. Pan, Apll. Phys. Lett. 64 (1994) 1502; D. M. Gruen, S. Liu, A. Krauss, L. Luo, X. Pan, J. Appl. Phys. 75 (1994) 1502; B. Bhattacharyya et al, Appl. Phys. Lett. 79 (2001) 1441, each of which is hereby incorporated by reference herein in its entirety].

The deposition environment of nanoD film is established predominantly on plasma-activated carbon precursor (methane/argon or methane (5-10%)/hydrogen gas mixtures). The optimum flow rates of such reactive gases vary depending on the effective pumping speed, plasma type, gas pressure, method of plasma generation, geometrical configuration of a reaction chamber, and other processing parameters.

The cBN layers can be prepared by a variety of ion-assisted physical vapor deposition (PVD) and plasma-enhanced (or ion assisted) chemical vapor deposition (PECVD) methods including magnetron sputtering, ion-assisted deposition, biased-plasma deposition and ion beam deposition [P. B. Mirkarimi et al., *Mater. Sci. Eng.*, vol. R21, pps. 47-100, "Review of advances in cubic boron nitride film synthesis," 1997, which is hereby incorporated by reference herein in its entirety]. Energetic particle bombardment (tens to hundreds of eV) coupled with the exposure to boron and nitrogen species can be employed for the formation and growth of the cBN phase. Examples of the exposure routes include sputtering of a boron nitride target, sputtering or evaporation of a boron source, boron-containing gas, and nitrogen or nitrogen-containing gas. The formation of nano-cBN layer in the MLC structure can be prepared at temperatures ranging from room temperature to 1100° C. The parameters leading to the nucleation and growth of nano-cBN by ion-assisted PVD methods include: (1) a minimal ion energy necessary to promote nucleation and growth, (2) a minimal substrate temperature, (3) a proper balance between the energetic species and the thermal species (I/A ratio), (4) a suitable composition of the species involved (B, N, and species assisting to chemical reactions) allowing to establish an equilibrium between the incorporation on one hand and the sputtering/etching/desorption rates on the other hand.

In the synthesis of nano-cBN layers of the MLC by CVD methods, boron gas and nitrogen gas sources react to form solid boron nitride phase. The boron gas is obtained by decomposition of boron-containing gas sources such as boron hydrides, boron halides, borohydrides, borofluorides or organic boron compounds. Pure nitrogen gas or nitrogen containing gas, e.g., hydrides of nitrogen or fluorides of nitrogen, can be selected as the nitrogen gas sources. Fluorine can be added into a gas mixture using fluorine gas, hydrogen fluoride or halogen fluoride. Fluorine can also be obtained by decomposition of an organic fluorine compound, a fluorine compound or by supplying metal fluoride into the gas phase.

Further, an inert gas such as argon or helium, or a hydrogen gas can be optionally added to the gas phase for controlling the plasma stability, plasma density, deposition rate, and film properties.

The fabrication method of the nano-cBN layers in the MLC can employ direct current, high frequency or radio-frequency bias with a negative offset. The practical value of the negative bias voltage applied can range from −10 to −1500 V. However, effective bias is the sum of the applied external bias and the plasma potential. The effective bias is responsible for the energy and momentum of incident ions. Since the effective bias involves the plasma potential, that can be from unit to hundreds of volts, the effective bias may vary depending upon many parameters such as the method of plasma generation, plasma type, presence of magnetic field, gas composition, gas pressure, substrate temperature, and substrate materials. Certainly the effect of plasma potential on effective bias is more pronounced at lower external bias voltages.

The following example is presented for further understanding of an embodiment of the MLC and a method of preparation therefor.

Example

Figure 2:
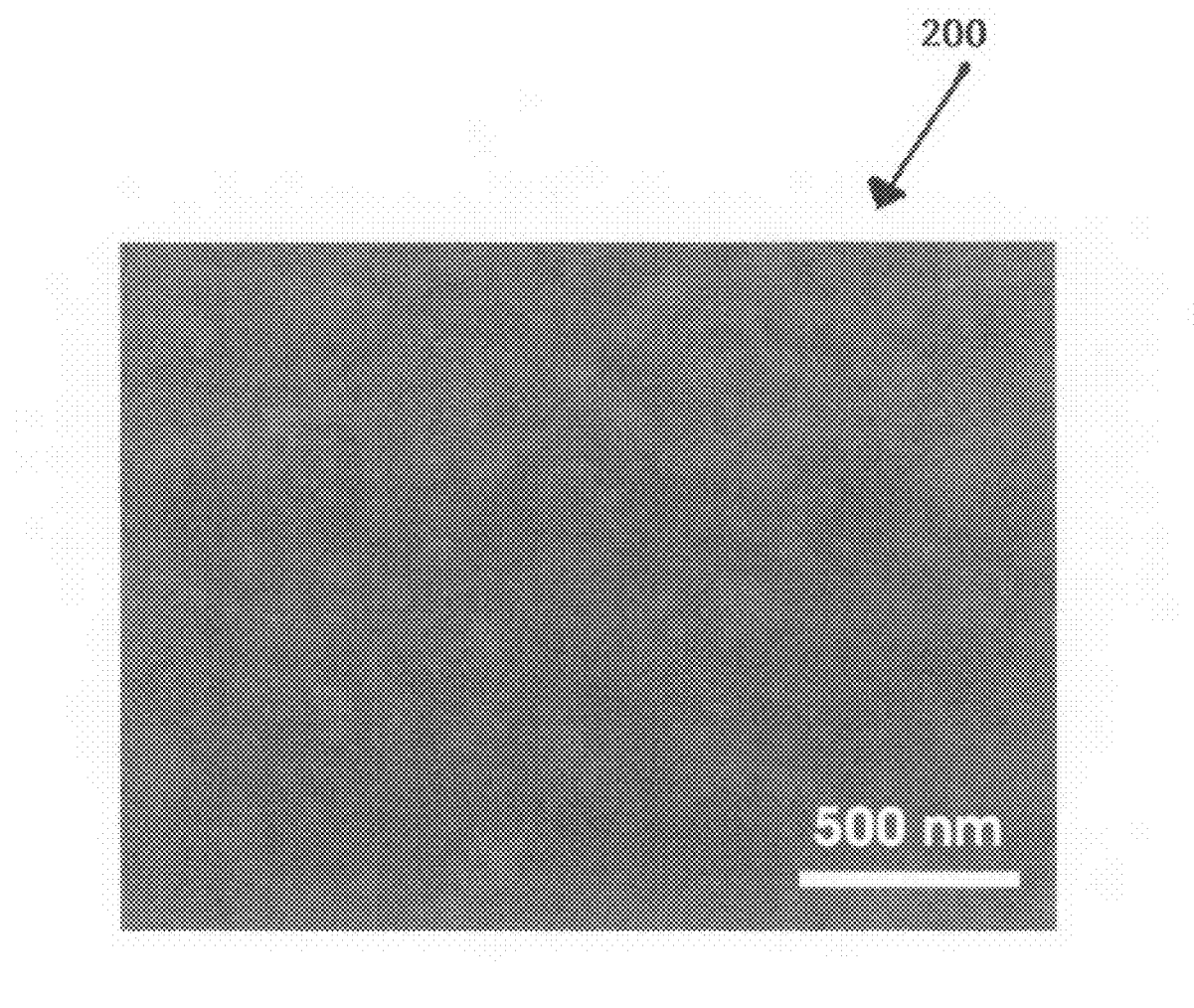
FIG. 2 is an SEM surface morphology of the base layer of nanocrystalline diamond (Nano-D) of FIG. 1.

Nanocrystalline diamond (nanoD) films are essential components in the MLC. The SEM image 200 in FIG. 2 shows the surface morphology of a nanoD film deposited on a silicon substrate. The film is composed of nanometer-sized grains that are formed by the competing process of growth and secondary nucleation. Since secondary nucleation was predominant during the deposition process, diamond crystallites are small and the resulting surface is smooth. Therefore surface polishing is not required. The nanoD films were prepared by microwave plasma CVD in a 10% $CH_4/H_2$ gas mixture at a total pressure of 30 Torr and an overall gas flow rate of 200 sccm. The microwave power and deposition temperature were maintained at 1200 W and 700° C., respectively. Furthermore, it was experimentally found that the grain size of nanoD could be controlled by the deposition parameters including temperature, gas pressure, and bias voltage.

Figure 3:
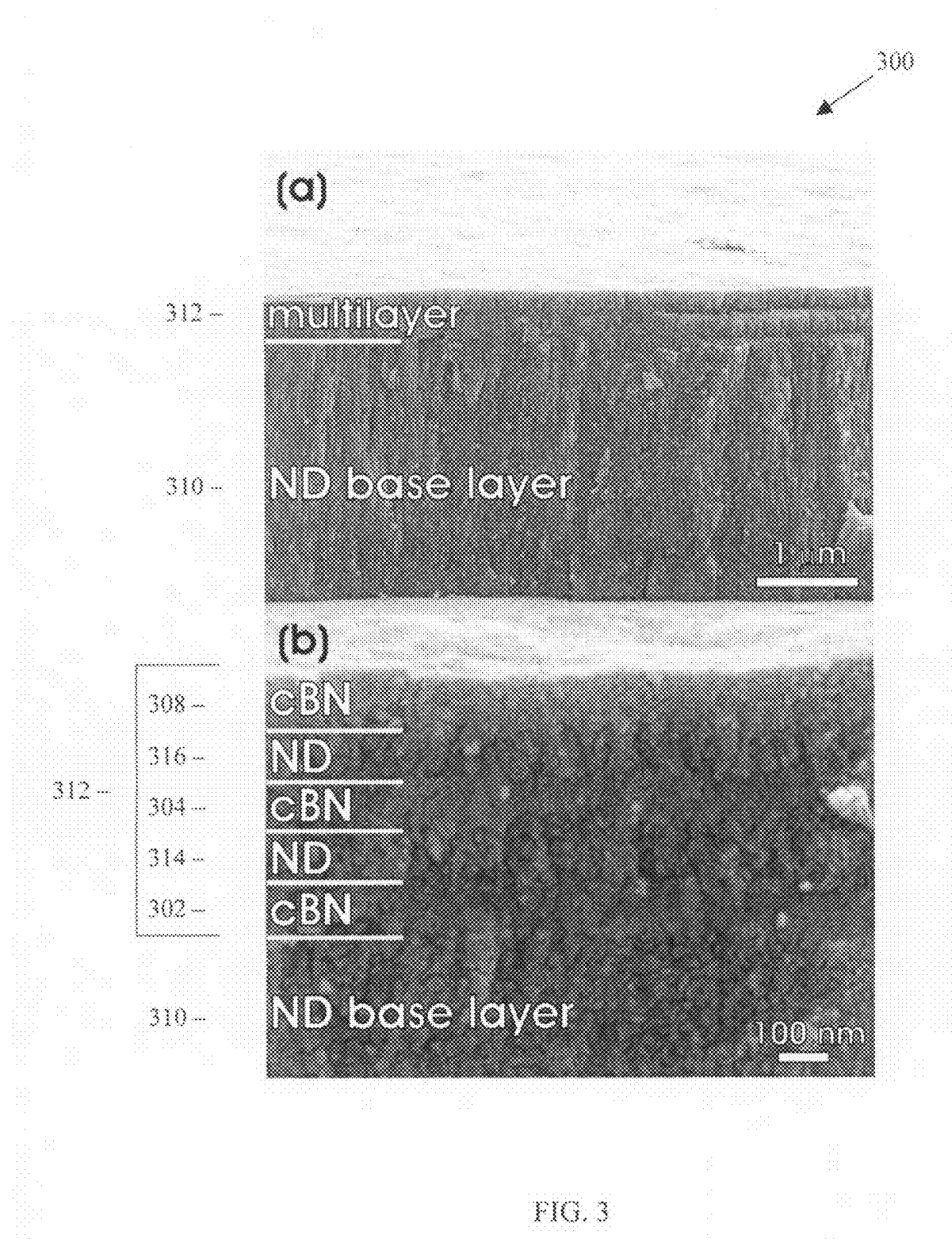
FIG. 3 is a cross-sectional (a) overall view and (b) enlarged view SEM image of a MLC according to one example of the invention with a top nano-cBN layer formed with five layers of alternating cBN and nanocrystalline diamond deposited on a thick base layer of NanoD.

The nano-cBN layers (302, 304, 308) of the MLC 300, as shown in FIGS. 3(a) and 3(b), were subsequently deposited by radio-frequency (RF) magnetron sputtering. The multilayer film thickness is about 500 nm excluding the NanoD base layer 310 (i.e., in this example three layers of nano-cBN and two layers of nanoD, 314 and 316). In sputter deposition, an unbalanced magnetron and substrate-target axis configuration were used. The base pressure of the deposition chamber was about $10^{-9}$ Torr. The sputter-target disk with 3 inches in diameter was 99.99% pure hexagonal BN, coupled to an Advanced Energy (RFX 500) RF (13.56 MHz) generator equipped with an auto-tuning matching unit. The sputtering was carried out in argon/nitrogen gas mixtures at an argon/nitrogen ratio of 2:1 with a total gas flow rate of 30 sccm. Plasma was induced at the 250 W radiofrequency (RF) power supplied to the target electrode with hBN sputtering disc. The substrate was biased by a high-frequency (HF) power supply operating at 333 kHz. Altering the HF voltage amplitude induced variable DC bias offset voltages which controlled the energy of ions impinging on the substrate. The substrate bias voltage and temperature were maintained at −35 V and ~900° C., respectively. Following the cBN deposition, the NanoD deposition process continued by transferring the sample to the aforementioned deposition system and under the deposition conditions identical to those used for the deposition of the NanoD base layer but for a shorter deposition time. The alternate cBN and diamond layer deposition is continued until the intended number of layers is obtained. FIG. 3 illustrates the deposition of five alternating nanoD and nano-cBN layers.

Figure 4:
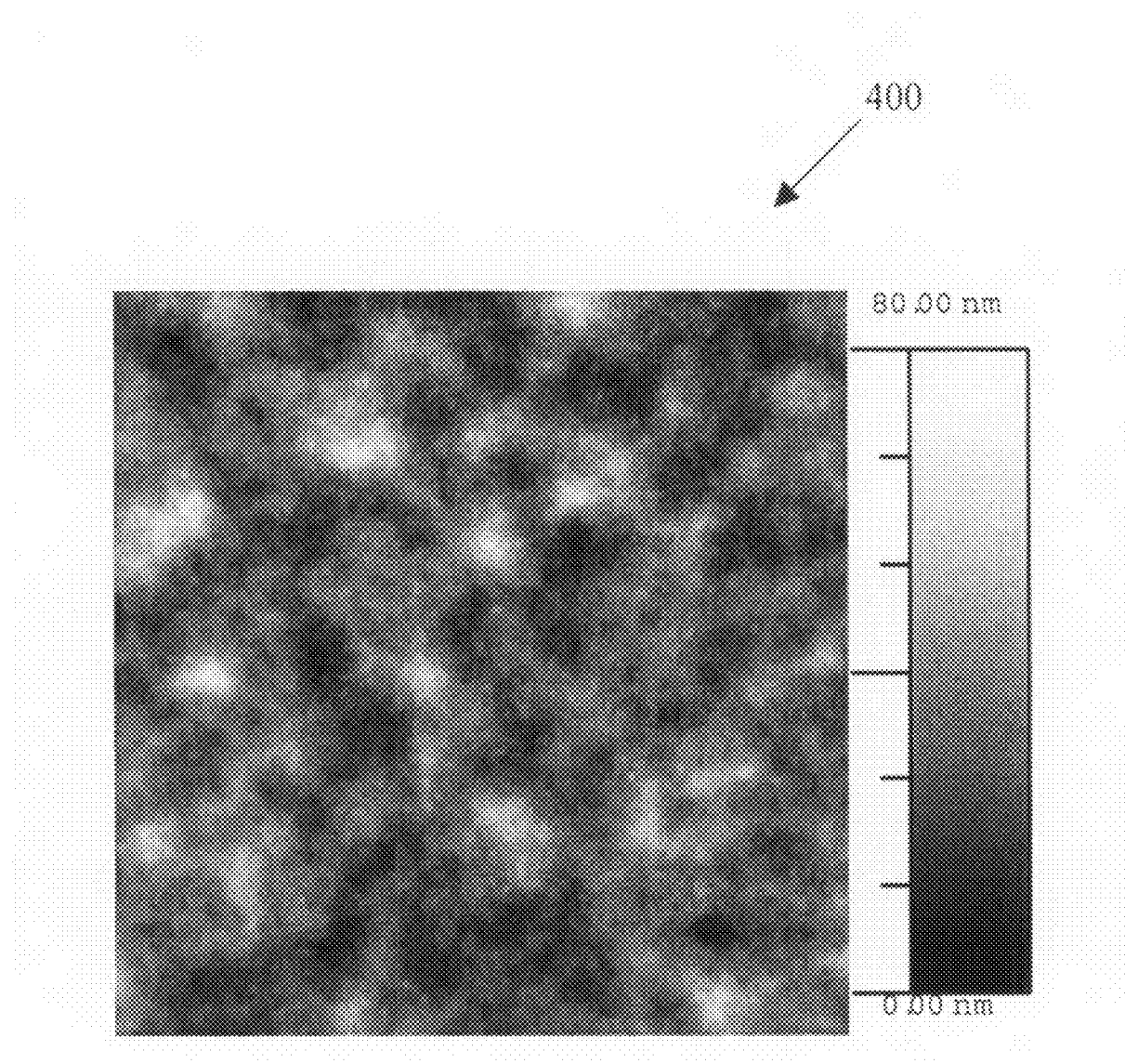
FIG. 4 is an atomic force microscopic surface morphology of a MLC as shown in FIG. 3 in a view field of 5×5 μm².

FIG. 4 shows the atomic force microscopic (AFM) plain-view image 400 of the MLC presented in FIG. 3. The small diamond crystallites induced by secondary nucleation maintain very smooth surfaces with a root-mean-square roughness of 5 nm.

Figure 5:
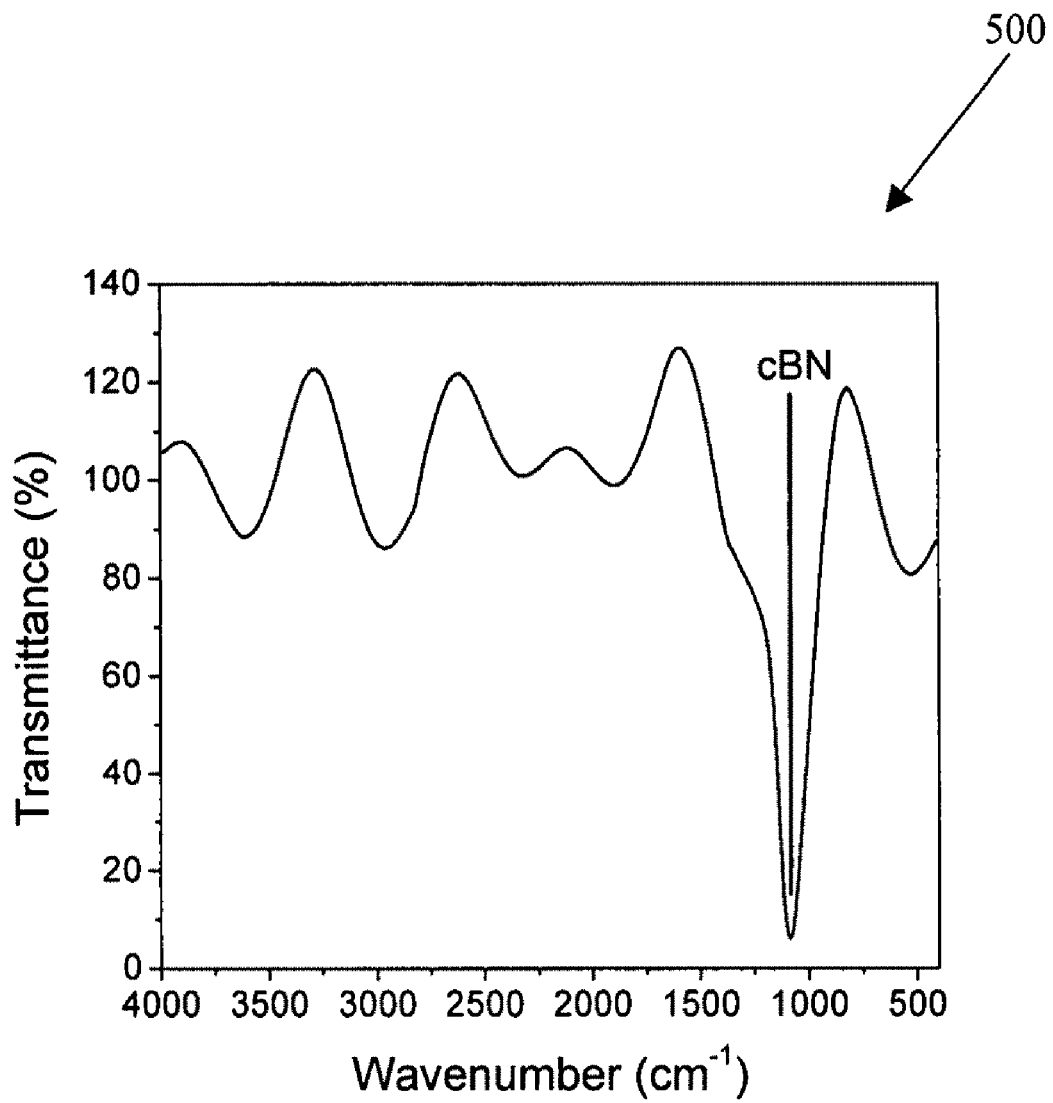
FIG. 5 illustrates the Fourier-transform infrared spectrum obtained from the MLC according to the example of FIG. 3.

FIG. 5 is the Fourier-transform infrared spectrum 500 collected from the MLC in FIG. 3. The infrared absorption of cBN appears in the vicinity of 1082 $cm^{-1}$. There is no detectable hexagonal/turbostratic/amorphous boron nitride absorption peaks located at 780 and 1380 $cm^{-1}$ indicating a nearly 100% pure cBN structure in the MLC.

Figure 6:
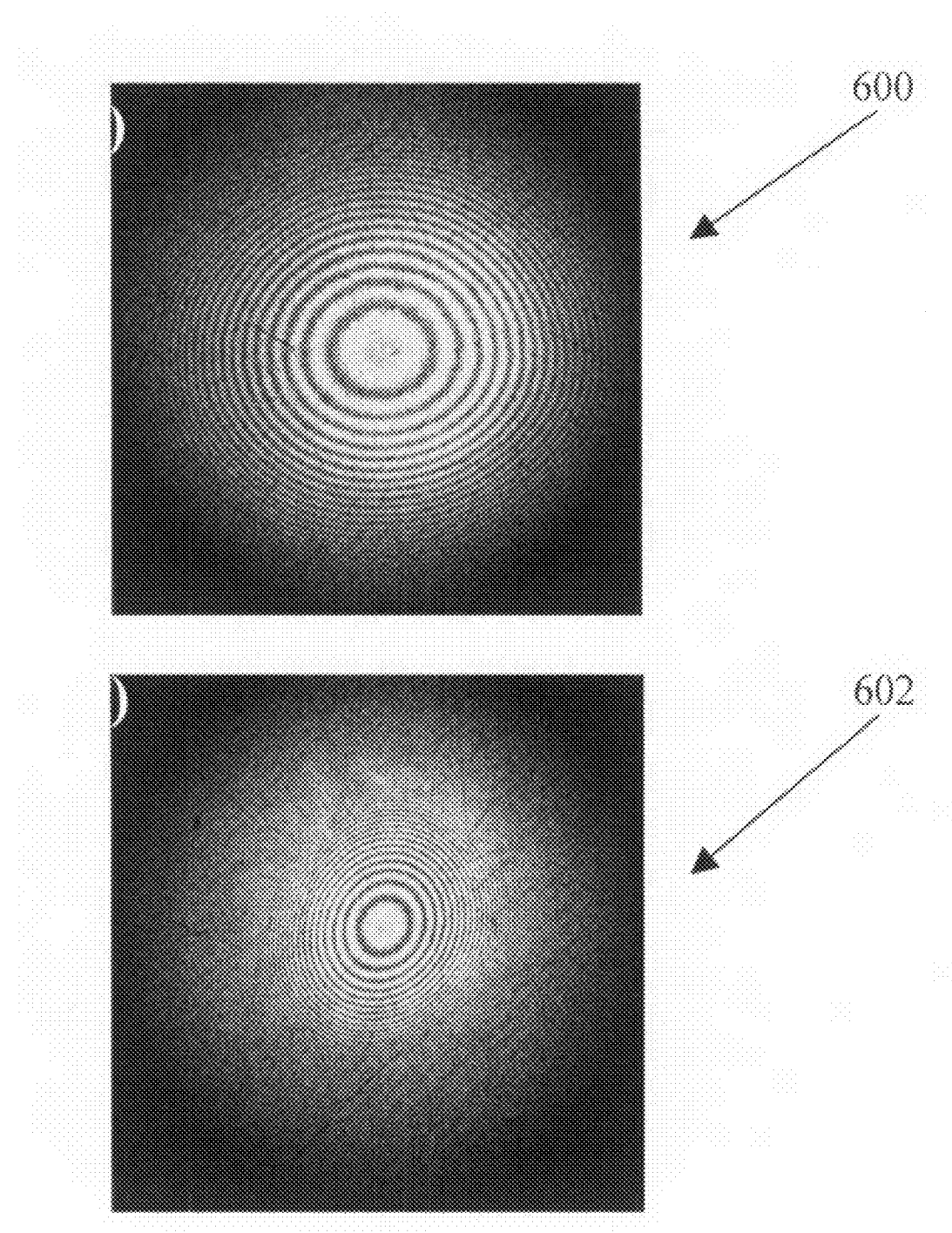
FIG. 6 illustrates the Newton's ring patterns obtained from (a) the MLC according to the example of FIG. 3 in cross-section and (b) a 500 nm thick cBN film.

FIG. 6(a) illustrates the Newton's ring patterns 600 obtained from the MLC presented in FIG. 3 and an individual 500 nm thick cBN film 602 deposited on the NanoD base layer with identical thickness obtained in the same run of deposition. It shows that the dark Newton's rings collected from the individual cBN film are characteristic of smaller diameters. Using Stoney's equation, the in-plane stresses of the MLC and the individual nano-cBN film are calculated to be 1.6 and 6.4 GPa, respectively. The multilayer coating stress is reduced to one fourth of that of the single nano-cBN film.

Figure 7:
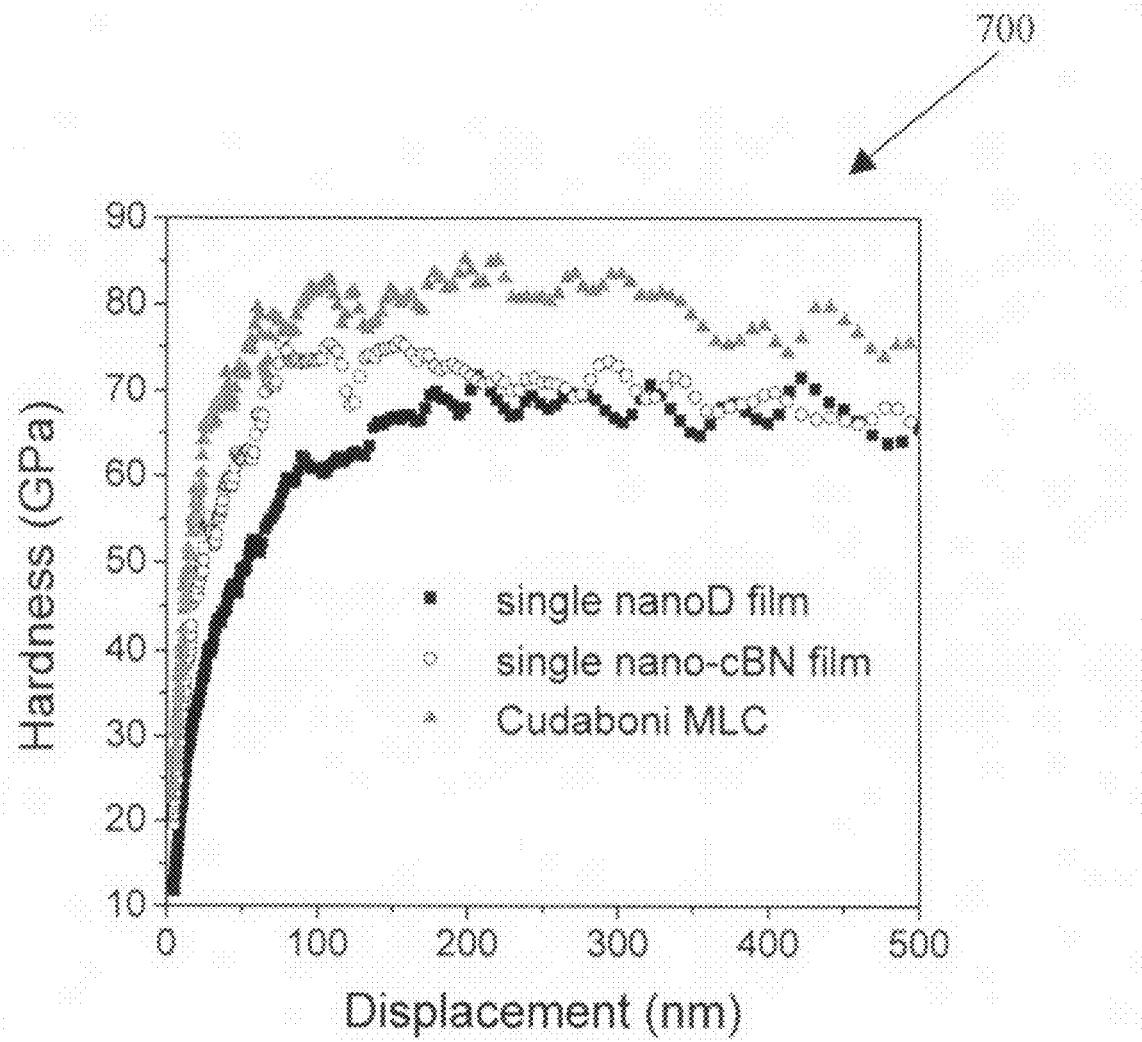
FIG. 7 illustrates the hardness values of individual nanocrystalline diamond and cBN films as well as the MLC of FIG. 3 determined from nanoindentation measurements in the plain-view direction.

The hardness of the MLC is compared to that of its constituents, nano-cBN and nanoD in the graph 700 of FIG. 7. It can be seen that the MLC according to the embodiment FIG. 3 is harder (~82 GPa) than its constituent materials (cBN~73 GPa and nanoD (~68 GPa). The properties of MLC can be designed for particular use by detailed engineering of the thickness of each cBN and nanoD in the multilayer structure. As a result the smooth coatings are more interesting than the individual nano-cBN film, suffering from high stress, poor adhesion, etc, when applied particularly to cutting tools and/or tribological surfaces. The MLCs have the characteristics of enhanced mechanical properties, lower coating stress, and high chemical stability of the overall coating provided by the top most cBN layer.

Figure 8:
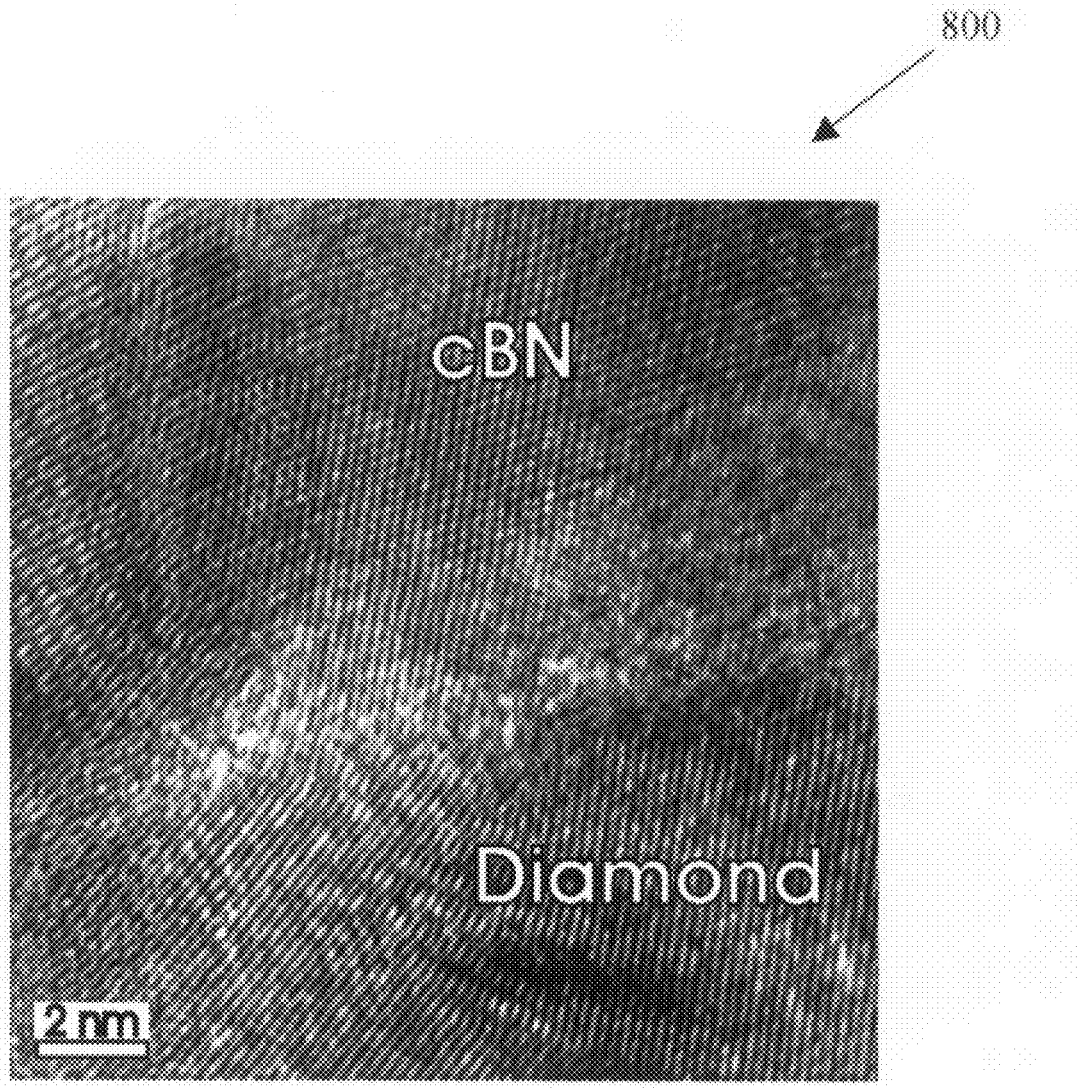
FIG. 8 is a cross-sectional high-resolution transmission electron microscopic image taken from the interfacial region between the cBN and nanocrystalline diamond layers of FIG. 3.

Atomic-scale investigation of the NanoD-cBN interface by high-resolution transmission electron microscopy (HRTEM) 800 in FIG. 8 reveals that cBN directly grows on diamond crystallites without any soft and humidity-sensitive turbostratic/amorphous boron nitride (tBN/aBN) intermediate layers. The compatibility of these two materials derives from their very similar physical properties and nearly identical structures. The direct growth of cBN crystallites on diamond crystallites is the fundamental provision for preparing stable and highly adherent MLCs. Accordingly, the MLC with absence of tBN/aBN transition layers presented herein are practical in many mechanical applications.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A multilayer coating formed on a substrate, the multilayer coating comprising: a base layer, and a plurality of nano-cBN and nanodiamond layers deposited on the said base layer in alternate sequence, wherein the cBN nanocrytallites nucleate directly on nanoD crystallites in said plurality of nano-cBN and nanodiamond layers.

2. A multilayer coating as claimed in claim 1 wherein said base layer is a layer of nanodiamond and the first layer in said alternate sequence is a layer of nano-cBN.

3. A multilayer coating as claimed in claim 1 wherein said base layer is a layer of single crystalline diamond or polycrystalline diamond and the first layer in said alternate sequence is a layer of nanodiamond.

4. A multilayer coating as claimed in claim 1 further comprising a buffer layer between the substrate and the base layer.

5. A multilayer coating as claimed in claim 1 wherein the plurality of alternating layers each have a thicknesses ranging from 1 to 100 nm.

6. A multilayer coating as claimed in claim 1 wherein the plurality of alternating layers terminate with a top nano-cBN layer.

7. A multilayer coating as claimed in claim 1 wherein the plurality of alternating layers terminate with a top nano-diamond layer.

8. A multilayer coating as claimed in claim 1 wherein the substrate is selected from a group consisting of semiconductors, insulators, metals, and alloys.

9. A multilayer coating as claimed in claim 1 wherein the substrate is pre-treated.

10. A multilayer coating as claimed in claim 9 wherein the substrate is pre-treated by the processes of enhanced seeding in hard powder suspension, prescratching, chemical etching and/or bias enhanced nucleation before depositing said base layer.

11. A multilayer coating as claimed in claim 1 wherein the nanocrystalline diamond films are deposited by cold and thermal plasma CVD.

12. A multilayer coating as claimed in claim 1 wherein the first layer of nanodiamond is polished prior to subsequent cBN deposition.

13. A multilayer coating as claimed in claim 1 wherein the nano-cBN layers are deposited by ion-assisted physical vapor deposition (PVD) and/or plasma-enhanced (or ion assisted) chemical vapor deposition (PECVD).

14. A multilayer coating as claimed in claim 1 wherein the nano-cBN layers are deposited by cold or thermal plasma CVD.

15. A multilayer coating as claimed in claim 14 wherein a negative bias is applied to the substrate during said deposition processes.

16. A multilayer coating as claimed in claim 1 wherein the coating stress is lower than that of individual nano-cBN components with identical thickness.

* * * * *